STABILIZED TRANSISTOR OSCILLATOR CIRCUIT

Filed Sept. 4, 1958

INVENTOR.
Leslie E. Scott
BY
Robert E. Fowler
ATTORNEY

United States Patent Office 2,996,614
Patented Aug. 15, 1961

2,996,614

STABILIZED TRANSISTOR OSCILLATOR CIRCUIT

Leslie E. Scott, Kokomo, Ind., assignor to General Motors Corporation, Detroit, Mich., a corporation of Delaware Filed Sept. 4, 1958, Ser. No. 758,964
3 Claims. (Cl. 250—20)

This invention relates to an oscillator circuit such as might be used as the local oscillator in a superheterodyne radio receiver to generate a wave frequency to beat or mix with the incoming carrier wave frequency.

In most local oscillator circuits it is desirable to have the response as flat as possible over the frequency band through which the oscillator is tuned in order to have a substantially constant output of the receiver.

It is therefore an object in making this invention to provide a transistorized local oscillator mixer circuit which gives a substantially constant output voltage throughout the band.

It is a further object in making this invention to provide a transistorized degenerative feedback stabilized oscillator-mixer circuit.

With these and other objects in view which will become apparent as the specification proceeds, my invention will be best understood by reference to the following specification and claims and the illustrations in the accompanying drawing, in which:

Figure 3:
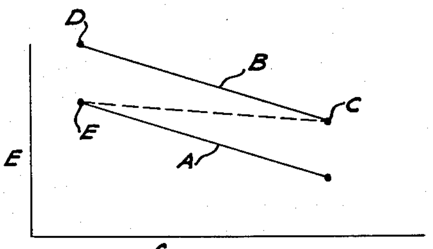
FIGURE 3 is a graph illustrating the response of various circuits over the band.

Referring more particularly to FIGURE 3, there is shown therein a graph of the voltage of oscillator output signals plotted against the frequency of oscillator-mixer circuits. The lower curve A shows a response curve for a conventional oscillatory circuit similar to that shown in FIGURE 1 without the corrective addition of the resistance 2 in circuit. It is to be noted that the amplitude of the signal generated drops off as the oscillator is tuned from low frequency to high frequency and experience indicates that the ratio of the low frequency signal to the high frequency signal may be as high as 4 to 1. If the designer then attempts to raise the response at the high frequency end by increasing the feedback or by other means, he may obtain a response curve similar to curve B merely moving the whole curve upwardly to gain an equal response at various points along the curve. By such means the designer may acquire sufficient response at the high frequency point C but he obtains more oscillator signal amplitude than can be properly handled at point D. Such a high amplitude of waves causes a clipping action by the amplifier circuit to flatten the tops and a distortion of the shape of the waves to provide unsatisfactory operation of the receiver. It is desired to obtain a substantially constant response from point E to point C such as is shown by the dotted line and this is accomplished by the addition of a resistor 2 between the collector and base electrodes to provide degenerative feedback as shown in the circuit diagrams.

Figure 1:
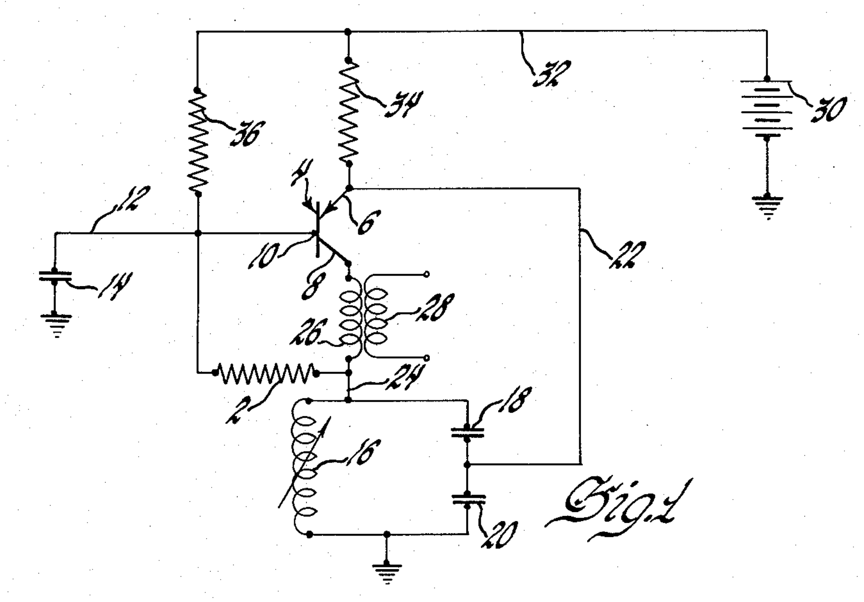
FIGURE 1 is a circuit diagram of an oscillator-mixer circuit embodying my invention in which the oscillator is permeability tuned.

Referring now more particularly to FIGURE 1, the circuit shown therein includes a mixing stage including transistor 4 having an emitter electrode 6, collector electrode 8 and base electrode 10. The input from the preceding stage is connected directly to input line 12 which in turn is directly connected to the base 10. Condenser 14 is connected between line 12 and ground. The oscillatory circuit in this case includes a tunable inductance 16 across which are connected two condensers 18 and 20 in series which act as a voltage divider, an intermediate terminal thereof being connected through line 22 with emitter 6. One terminal of the tunable inductance 16 is connected to ground and the opposite terminal through line 24 to one side of an intermediate frequency transformer primary winding 26, the opposite terminal of which is connected to collector 8. The secondary winding 28 of the intermediate frequency transformer may be connected to the following stage of the receiver.

The power for the stage is supplied by any desired source such as a battery 30, one terminal of which is connected to ground and the other through conductor 32 to one terminal of resistor 34 and also one terminal of resistor 36. The remaining terminal of resistance 34 is connected to line 22 and to the emitter 6 and the remaining terminal of resistor 36 is connected to line 12 and the base 10. The stabilizing feedback resistance 2 is ordinarily connected from the base 10 to ground and the voltage divider consisting of resistance 36 and resistance 2 would then apply the proper bias to the base which would be a fixed bias. In this case, however, the remaining terminal of resistance 2 is connected to line 24 and provides a stabilizing degenerative feedback to the base which keeps the response almost constant as the oscillator frequency is tuned over the band.

When the incoming signal is applied to line 12, a frequency generated in the oscillator which includes components 16, 18, 20 is applied through the emitter and the beat frequency which is the result of the frequency of the applied wave and the locally generated frequency wave is developed in the output including collector 8 and IF primary 26. This particular frequency is transferred to the secondary 28 and applied to the next stage. Until the oscillator starts oscillating, there is no feedback applied to the base from the oscillator but as soon as the oscillation does come in, a percentage of the oscillator output is fed back to the input through resistor 2. This tends to regulate the gain of the stage and the more the oscillator amplitude tends to increase, the more voltage is fed back to compensatte and the gain is reduced. Thus, through the simple connection of this resistance from the base to the oscillator tuned circuit, the stage is stabilized as the oscillator is tuned to different frequencies without diminishing the intermediate frequency amplification since it is the low voltage side of the output transformer that is connected to the feedback circuit through resistance 2.

Figure 2:
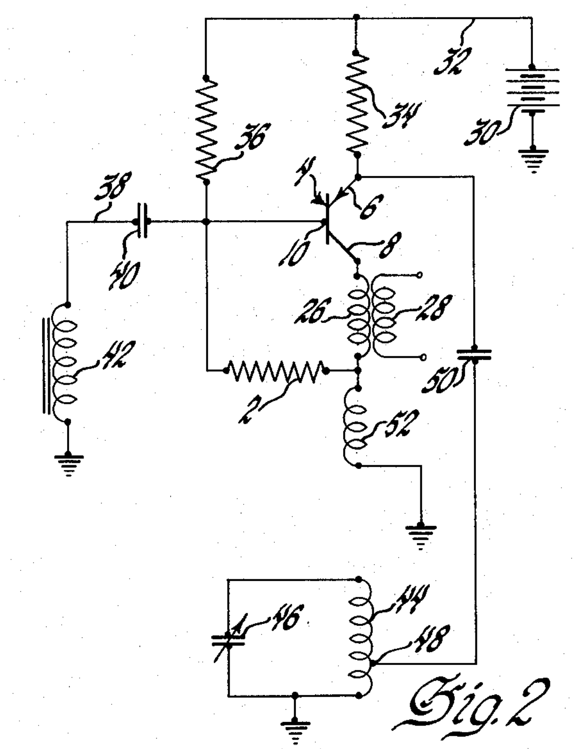
FIGURE 2 is a circuit diagram of an oscillator-mixer circuit including a capacity tuned element for tuning it over the band.

FIGURE 2 is in the main similar to FIGURE 1 except that it shows a condenser tuned receiver instead of a permeability tuned one. In that instance the battery 30 supplies power for the stage to line 32 and resistances 34 and 36 as before. The input signal is applied to line 38 and then through condenser 40 to the base 10 of the transistor 4. The intermediate frequency transformer primary 26 is connected in the collector lead as in FIGURE 1, and the secondary 28 provides the output signal. In this instance transformer secondary 42 is connected between line 38 and ground at the input end. The oscillator in this instance is a simple resonant circuit including a coil 44 in shunt to a variable tuning condenser 46. One side of the resonant circuit is grounded and a tap 48 on the coil is connected through coupling condenser 50 to the emitter electrode 6. The normal oscillator feedback is accomplished through tickler coil 52 which is connected in series between the one terminal of the IF transformer 26—28 and ground and is inductively coupled with the coil 44. As in FIGURE 1, the stabilizing balancing resistor 2 is coupled between one terminal of the IF transformer primary 26 and the base 10, and applies sufficient degenerative feedback to stabilize this converter stage.

I claim:

1. A circuit arrangement comprising a transistor having base, collector and emitter electrodes, an input circuit connected to said base electrode to apply high frequency waves thereto, a tunable resonant circuit connected to said emitter electrode so that a locally generated high frequency wave will be heterodyned with the incoming waves to develop a resultant beat fequency wave signal, an output impedance means having two terminals one connected to the collector electrode and the other to the tunable resonant circuit and feedback impedance means connected between the tunable resonant circuit and the base of the transistor to provide degenerative stabilizing feedback so that the output signal voltage will be substantially constant over the frequency range of the stage.

2. A circuit arrangement comprising a transistor having base, collector and emitter electrodes, an input circuit connected to said base electrode to apply high frequency waves thereto, a tunable resonant circuit connected to said emitter electrode to inject the local frequency into the transistor to mix with the incoming signal frequency waves applied to the input, an output impedance means having two terminals, one connected to the collector electrode and the other to the tunable resonant circuit and feedback impedance means connected directly between the tunable resonant circuit and the base electrode to provide degenerative feedback for stability and substantially constant gain over the frequency range.

3. A circuit arrangement comprising a transistor having base, collector and emitter electrodes, an input circuit connected to said base electrode to apply high frequency signal waves thereto, a tunable resonant circuit connected to said emitter electrode to inject a locally generated frequency into the transistor, an output circuit connected to said collector electrode in which a beat frequency signal is developed, and a feedback impedance means connected between the tunable resonant circuit and the base electrode to feed back a certain portion of the signal to provide degenerative feedback to the base and stabilize the gain as the frequency changes.

References Cited in the file of this patent

UNITED STATES PATENTS 2,880,312 Koch ---------------- Mar. 31, 1959

OTHER REFERENCES

Electronics Engineering, January 3, 1958, edition, page 66, "Transistor Reflex Circuit Trims Receiver Costs."